(12) United States Patent
Chung et al.

(10) Patent No.: US 12,707,613 B2
(45) Date of Patent: Aug. 11, 2026

(54) ELECTROMAGNETIC WAVE ABSORPTION DEVICE

(71) Applicant: ELECTRONICS AND TELECOMMUNICATIONS RESEARCH INSTITUTE, Daejeon (KR)

(72) Inventors: Yong-Duck Chung, Daejeon (KR); Woo Jung Lee, Daejeon (KR); Daehyung Cho, Daejeon (KR); Tae-Ha Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 58 days.

(21) Appl. No.: 18/796,801

(22) Filed: Aug. 7, 2024

(65) Prior Publication Data

US 2025/0071961 A1 Feb. 27, 2025

(30) Foreign Application Priority Data

Aug. 25, 2023 (KR) ........................ 10-2023-0112180

(51) Int. Cl.
*H01Q 17/00* (2006.01)
*H05K 9/00* (2006.01)

(52) U.S. Cl.
CPC ......... *H05K 9/0086* (2013.01); *H01Q 17/007* (2013.01); *H05K 9/0084* (2013.01)

(58) Field of Classification Search
CPC .................................................... H01Q 17/007
See application file for complete search history.

(56) References Cited

U.S. PATENT DOCUMENTS

| | | | | |
|---|---|---|---|---|
| 9,134,465 | B1 * | 9/2015 | Cohen | F41H 3/00 |
| 9,491,118 | B1 | 11/2016 | Nessel et al. | |
| 2003/0207093 | A1 | 11/2003 | Tsuji et al. | |

(Continued)

FOREIGN PATENT DOCUMENTS

| | | |
|---|---|---|
| KR | 10-2003-0045607 A | 6/2003 |
| KR | 10-2012-0059019 A | 6/2012 |

(Continued)

OTHER PUBLICATIONS

Xiao Zhang et al., "Topological insulators for high performance terahertz to infrared applications," Phys. Rev. B, 2011.

(Continued)

*Primary Examiner* — Hung V Ngo

(57) ABSTRACT

Provided is an electromagnetic wave absorption device. The electromagnetic wave absorption device includes a substrate and an electromagnetic wave absorption layer on the substrate. The electromagnetic wave absorption layer contains a chalcogenide material. The electromagnetic wave absorption layer contains Bi, Sb, $Bi_2Se_3$, $Bi_2Te_3$, $Sb_2Te_3$, $Bi_{1-x}Sb_x$, $Bi_{1.1}Sb_{0.9}Te_2S$, or $(Bi,Sb)_2(Se,Te,S)_3$. The electromagnetic wave absorption layer is on an entire surface of an upper surface of the substrate.

15 Claims, 10 Drawing Sheets

(56) References Cited

U.S. PATENT DOCUMENTS

| | | | | |
|---|---|---|---|---|
| 2004/0100343 | A1 | 5/2004 | Tsu et al. | |
| 2009/0272560 | A1* | 11/2009 | Tokunaga | H05K 9/0096 174/126.1 |
| 2012/0132804 | A1 | 5/2012 | Lee et al. | |
| 2019/0131201 | A1 | 5/2019 | Yun et al. | |
| 2019/0323905 | A1 | 10/2019 | Kim et al. | |
| 2021/0151895 | A1* | 5/2021 | Ohkoshi | H01F 1/375 |
| 2022/0299839 | A1 | 9/2022 | Jiang et al. | |

FOREIGN PATENT DOCUMENTS

| | | | |
|---|---|---|---|
| KR | 10-1584092 | B1 | 1/2016 |
| KR | 10-2082979 | B1 | 2/2020 |
| KR | 10-2023-0049514 | A | 4/2023 |

OTHER PUBLICATIONS

M.Z. Mohyedin et al., “First-principles calculations of electronic and optical properties of orthorhombic Bi2Se3 nano thin film,” Computational Condensed Matter, 2022, vol. 30, e00618.

Jung Kwang-Sik et al., “Research trends on optoelectronic devices using chalcogenide-based topological insulators,” Electrical & Electronic Materials, 2021, vol. 34, No. 3.

* cited by examiner e
photon
μ
h
k
TI
120

3,4
e
photon
μ
k
h
1,2
TI
120
Hybridization

ELECTROMAGNETIC WAVE ABSORPTION DEVICE

CROSS-REFERENCE TO RELATED APPLICATION

This U.S. non-provisional patent application claims priority under 35 U.S.C. § 119 of Korean Patent Application No. 10-2023-0112180, filed on Aug. 25, 2023, the entire contents of which are hereby incorporated by reference.

BACKGROUND

The present disclosure herein relates to an electromagnetic wave absorption device, and more specifically, to an electromagnetic wave absorption device that absorbs electromagnetic waves.

A technology that shields electromagnetic waves through absorption may be used in various fields such as smartphones, base stations (small cells), autonomous vehicle radar, and low-orbit communication satellite antennas that utilize 5G/6G communications. In particular, an absorption and shielding material for the 5G/6G band is a new material that requires high-level physical property design technology, and groups that have succeeded in commercializing it are limited to the United States, Germany, and Japan globally. In order to realize the future image of 6G, six technological characteristics that include hyper-space, hyper-intelligence, and hyper-trust, in addition to the expansion of ultra-high speed, ultra-low latency, and ultra-connectivity, which are the requirements of 5G, are required. Among the major core technologies, THz RF component technology required to develop RF/antenna components for THz 6G base stations/terminals that operate from 114 GHz to 1 THz and support a bandwidth of up to 30 GHz, and optical-based component technology are needed. As frequencies above 100 GHz and a bandwidth of up to 40 GHz, which have not been used for communication at the THz frequency, are needed, materials and evaluation technologies for electromagnetic wave safety of propagation channel models and base stations/terminals required for wireless transmission system design are needed. Materials that do not reflect electromagnetic waves for high-level 5G communication but absorb more than 90% are required, and these technologies are essentially required to solve secondary interference problems even in the high GHz frequency usage environment of 5G communication.

SUMMARY

The present disclosure provides an electromagnetic wave absorption device that may increase an absorption rate of electromagnetic waves.

An embodiment of the inventive concept provides an electromagnetic wave absorption device. The electromagnetic wave absorption device includes a substrate and an electromagnetic wave absorption layer on the substrate. Here, the electromagnetic wave absorption layer may contain a chalcogenide material.

In an embodiment, the electromagnetic wave absorption layer may contain Bi, Sb, $Bi_2Se_3$, $Bi_2Te_3$, $Sb_2Te_3$, $Bi_{1-x}Sb_x$, $Bi_{1.1}Sb_{0.9}Te_2S$, or $(Bi,Sb)_2(Se,Te,S)_3$.

In an embodiment, the electromagnetic wave absorption layer may be provided on an entire surface of an upper surface of the substrate.

In an embodiment, the electromagnetic wave absorption layer may include a meta-structure.

In an embodiment, the meta-structure may have a cross shape.

In an embodiment, the meta-structure may have a bar shape extending in one direction.

In an embodiment, the electromagnetic wave absorption layer may include a topological insulator layer and absorption patterns on the topological insulator layer.

In an embodiment, the absorption patterns may include a meta-structure.

In an embodiment, each of the absorption patterns may have a cross shape.

In an embodiment, the electromagnetic wave absorption layer may have a thickness of 1 nm to 10 mm.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
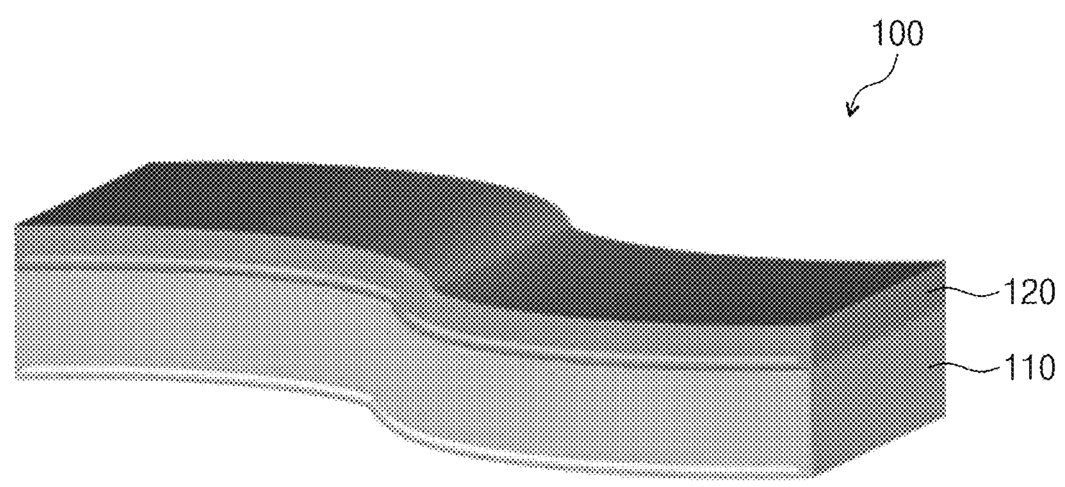
FIG. 1 is a perspective view illustrating an example of an electromagnetic wave absorption device according to an embodiment of the inventive concept.

Hereinafter, an embodiment of the inventive concept will be described in detail with reference to the accompanying drawings. The advantages and features of an embodiment of the inventive concept and a method for achieving them will become clear by referring to embodiments described in detail below along with the accompanying drawings. However, an embodiment of the inventive concept is not limited to the embodiments set forth herein and may be embodied in different forms. Rather, the embodiments introduced herein are provided so that the disclosed content will be thorough and complete and will fully convey the spirit of the inventive concept to those skilled in the art, and an embodiment of the inventive concept is defined only by the scope of the claims. The same reference numerals refer to the same components throughout the specification.

The terms used in this specification are for describing embodiments and are not intended to limit the embodiment of the inventive concept. In this specification, a singular form includes a plural form unless specifically stated otherwise in the context. The component referred to in terms "comprises" and/or "comprising" as used in the specification do not preclude the existence or addition of a referenced component, or one or more other components, operations and/or elements. In addition, since this is according to an embodiment, reference signs numerals presented according to the order of description are not necessarily limited to that order.

In addition, the embodiments described in this specification will be described with reference to cross-sectional views and/or plan views, which are ideal illustrations of an embodiment of the inventive concept. In the drawings, the thicknesses of films and regions are exaggerated for effective explanation of technical content. Accordingly, the form of the illustration may be modified due to manufacturing technology and/or tolerance, etc. Accordingly, embodiments of the inventive concept are not limited to the specific form shown, but also include changes in form produced according to the manufacturing process.

FIG. 1 illustrates an example of an electromagnetic wave absorption device 100 according to an embodiment of the inventive concept.

Referring to FIG. 1, the electromagnetic wave absorption device 100 of an embodiment of the inventive concept may include a substrate 110 and an electromagnetic wave absorption layer 120 on the substrate 110.

The substrate 110 may include a silicon wafer. Alternatively, the substrate 110 may include an amorphous material such as glass, plastic, metal foil, or silicon on insulator (SOI) substrate, but an embodiment of the inventive concept is not limited thereto.

The electromagnetic wave absorption layer 120 may be provided on the entire surface of an upper surface of the substrate 110. The electromagnetic wave absorption layer 120 may include a topological insulator made of chalcogenide material. The topological insulator made of chalcogenide may be formed on the substrate 110 by a physical vapor deposition method, a chemical vapor deposition method, or a transfer method. The physical vapor deposition methods may include molecular beam epitaxy (MBE), pulsed laser deposition, and magnetron sputtering methods. The transfer method may include a Bridgman crystal growth method. For example, the electromagnetic wave absorption layer 120 may include a single compound of group 15 or compounds of groups 15 and 16, such as Bi, Sb, $Bi_2Se_3$, $Bi_2Te_3$, $Sb_2Te_3$, $Bi_{1-x}Sb_x$, $Bi_{1.1}Sb_{0.9}Te_2S$, $(Bi,Sb)_2(Se,Te,S)_3$, etc. The electromagnetic wave absorption layer 120 may be an electromagnetic wave shielding layer.

Therefore, the electromagnetic wave absorption device 100 of an embodiment of the inventive concept may increase an absorption rate of electromagnetic waves by using the electromagnetic wave absorption layer 120 made of a chalcogenide material.

Figure 2:
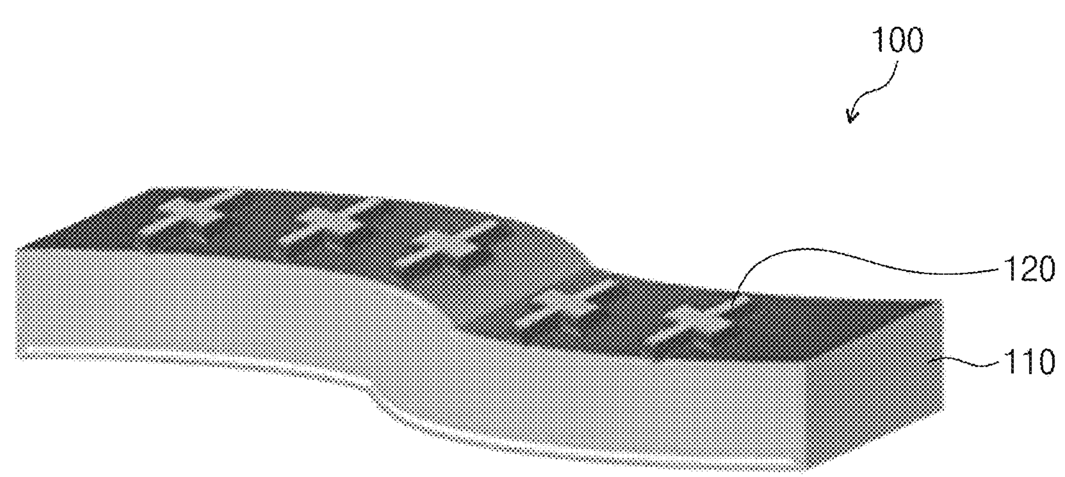
FIG. 2 is a perspective view illustrating an example of an electromagnetic wave absorption device according to an embodiment of the inventive concept.

FIG. 2 illustrates an example of the electromagnetic wave absorption device 100 according to an embodiment of the inventive concept.

Referring to FIG. 2, the electromagnetic wave absorption layer 120 of the electromagnetic wave absorption device 100 of an embodiment of the inventive concept may include a meta-structure. The meta-structure of the electromagnetic wave absorption layer 120 may have a cross shape or a scissor shape when viewed in a planar view.

Figure 3:
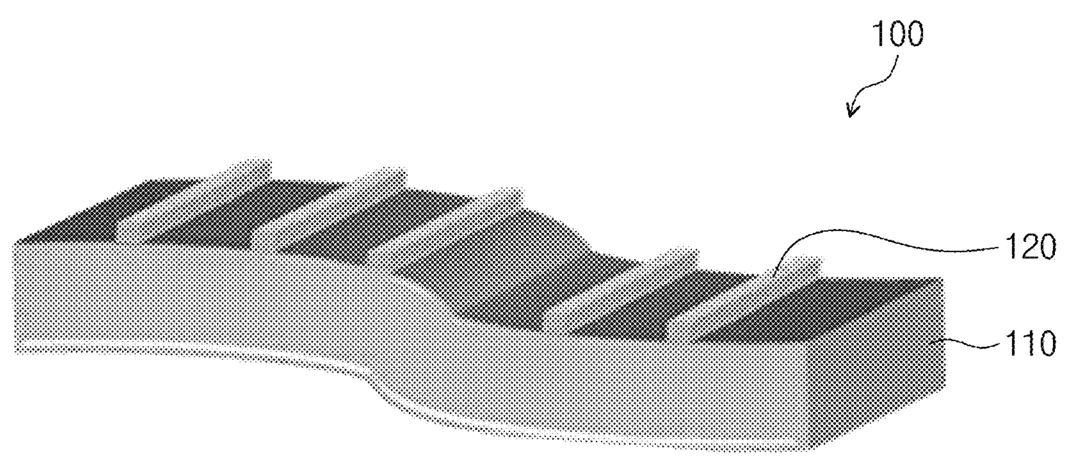
FIG. 3 is a perspective view illustrating an example of an electromagnetic wave absorption device according to an embodiment of the inventive concept.

FIG. 3 illustrates an example of the electromagnetic wave absorption device 100 according to an embodiment of the inventive concept.

Referring to FIG. 3, the meta-structure of the electromagnetic wave absorption layer 120 may have a bar shape or a straight shape extending in one direction in a planar view.

Figure 4:
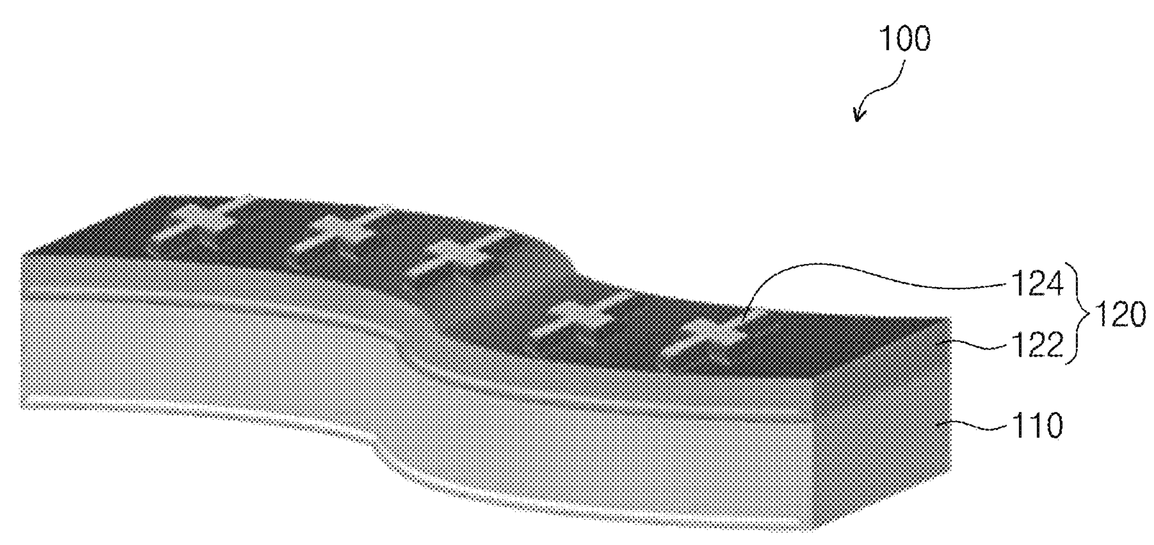
FIG. 4 is a perspective view illustrating an example of an electromagnetic wave absorption device according to an embodiment of the inventive concept.

FIG. 4 illustrates an example of the electromagnetic wave absorption device 100 according to an embodiment of the inventive concept.

Referring to FIG. 4, the electromagnetic wave absorption layer 120 of the electromagnetic wave absorption device 100 of an embodiment of the inventive concept may include a topological insulator layer 122 and an absorption pattern 124.

The topological insulator layer 122 may be provided on the entire surface of the upper surface of the substrate 110. The topological insulator layer 122 may contain the chalcogenide material.

The absorption pattern 124 may be provided on the topological insulator layer 122. The absorption pattern 124 may include the meta-structure. The absorption pattern 124 may have the cross shape or the scissor shape in a planar view. The absorption pattern 124 may contain the chalcogenide material.

Figure 5:
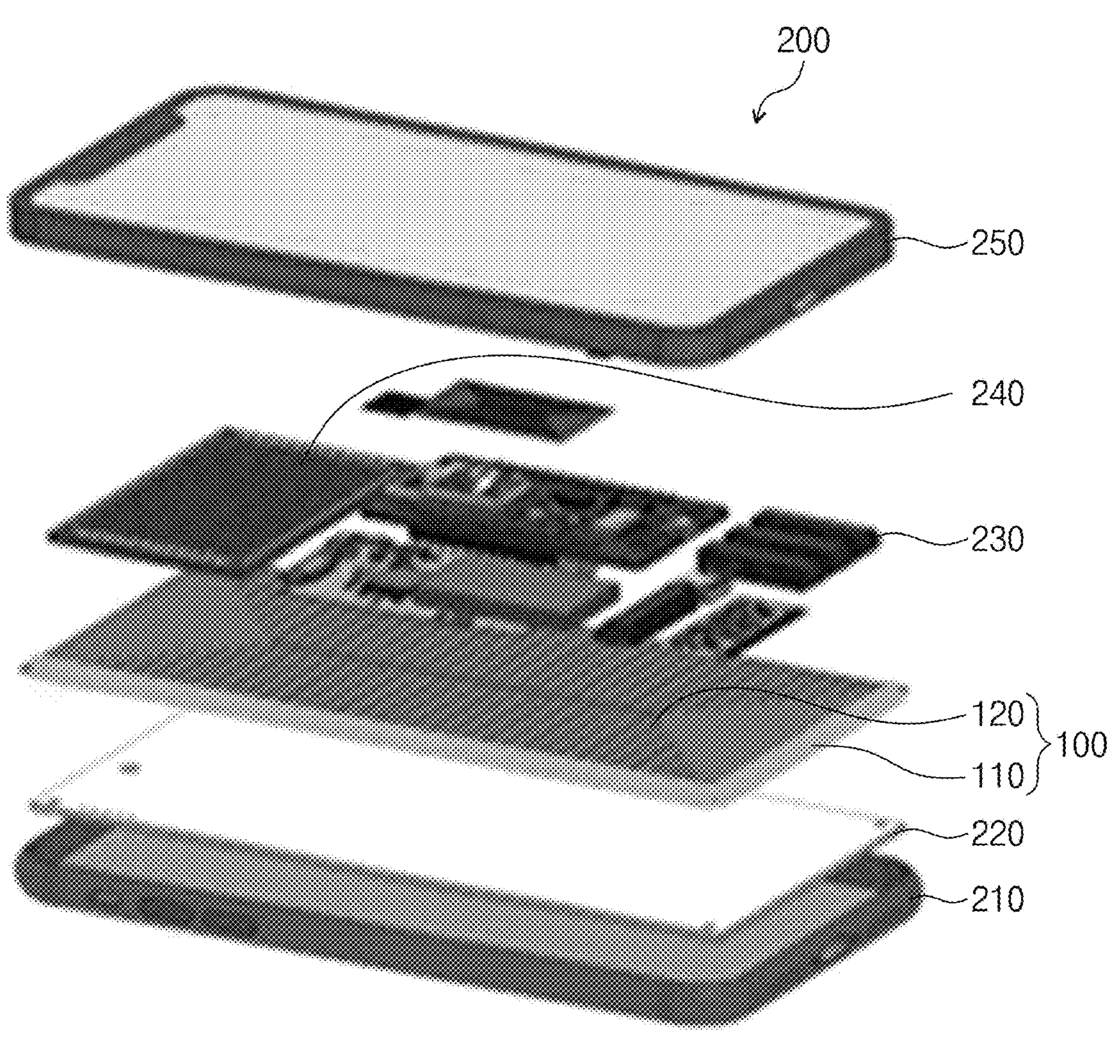
FIG. 5 is an exploded perspective view illustrating an example of a mobile phone to which an electromagnetic wave absorption device according to an embodiment of the inventive concept is applied.

FIG. 5 illustrates an example of a mobile phone 200 to which the electromagnetic wave absorption device 100 according to an embodiment of the inventive concept is applied.

Referring to FIG. 5, the mobile phone 200 of an embodiment of the inventive concept includes a rear case 210, a heat dissipation layer 220, the electromagnetic wave absorption device 100, semiconductor elements 230, a battery 240, and a display component 250. The rear case 210 may include a plastic or alloy housing. The heat dissipation layer 220 may be provided within the rear case 210. The electromagnetic wave absorption device 100 may be provided on the heat dissipation layer 220. The semiconductor devices 230 may be provided on the electromagnetic wave absorption device 100.

Figure 6:
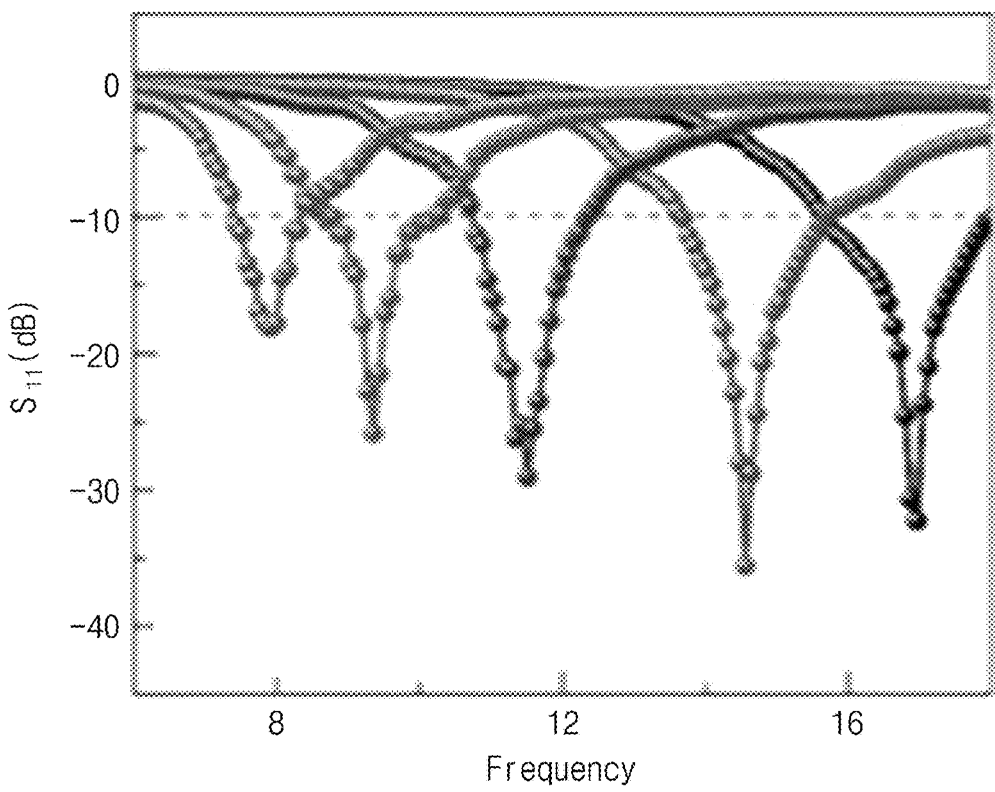
FIG. 6 is a graph illustrating an absorption band according to a thickness of an electromagnetic wave absorption layer of FIG. 4.

FIG. 6 illustrates an absorption band according to a thickness of the electromagnetic wave absorption layer 120 of FIG. 4.

Referring to FIG. 6, the electromagnetic wave absorption device 100 of an embodiment of the inventive concept may control the absorption characteristics of a specific band depending on a thickness of the topological insulator layer 122 of the electromagnetic wave absorption layer 120.

Figure 7:
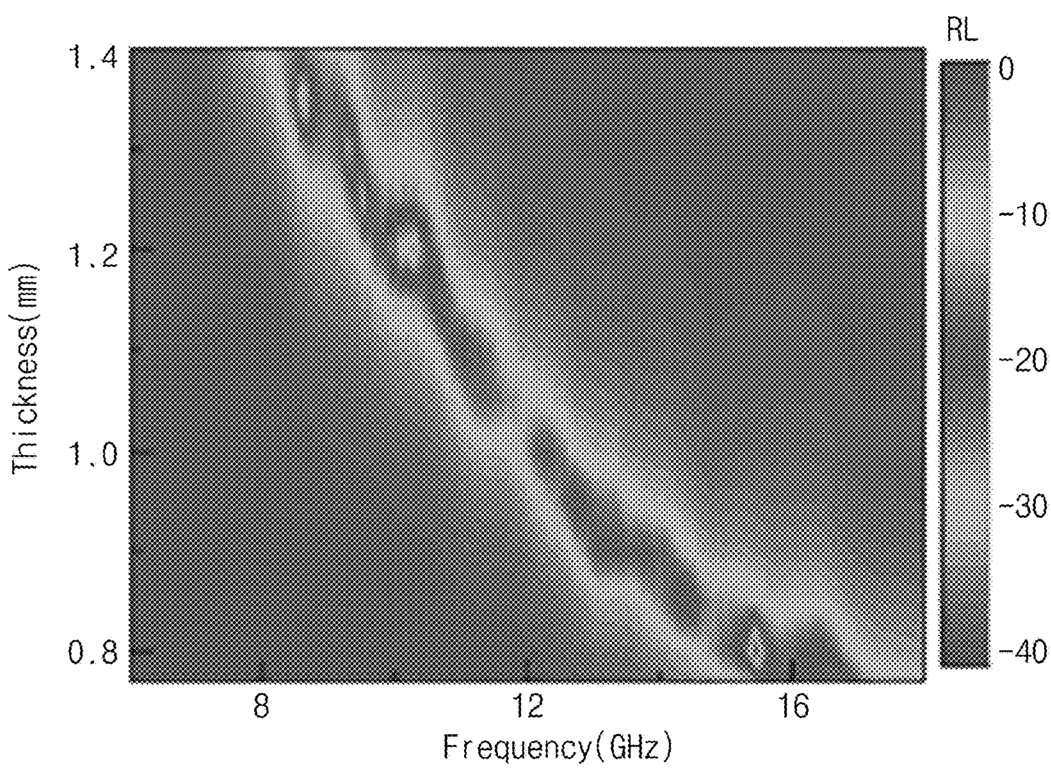
FIG. 7 is a graph illustrating an absorption band according to an absorption pattern of FIG. 4.

FIG. 7 illustrates the absorption band by the absorption pattern 124 of FIG. 4.

Referring to FIG. 7, the electromagnetic wave absorption device 100 of an embodiment of the inventive concept may control an absorption bandwidth of a specific band according to a shape of the absorption pattern 124.

Figure 8:
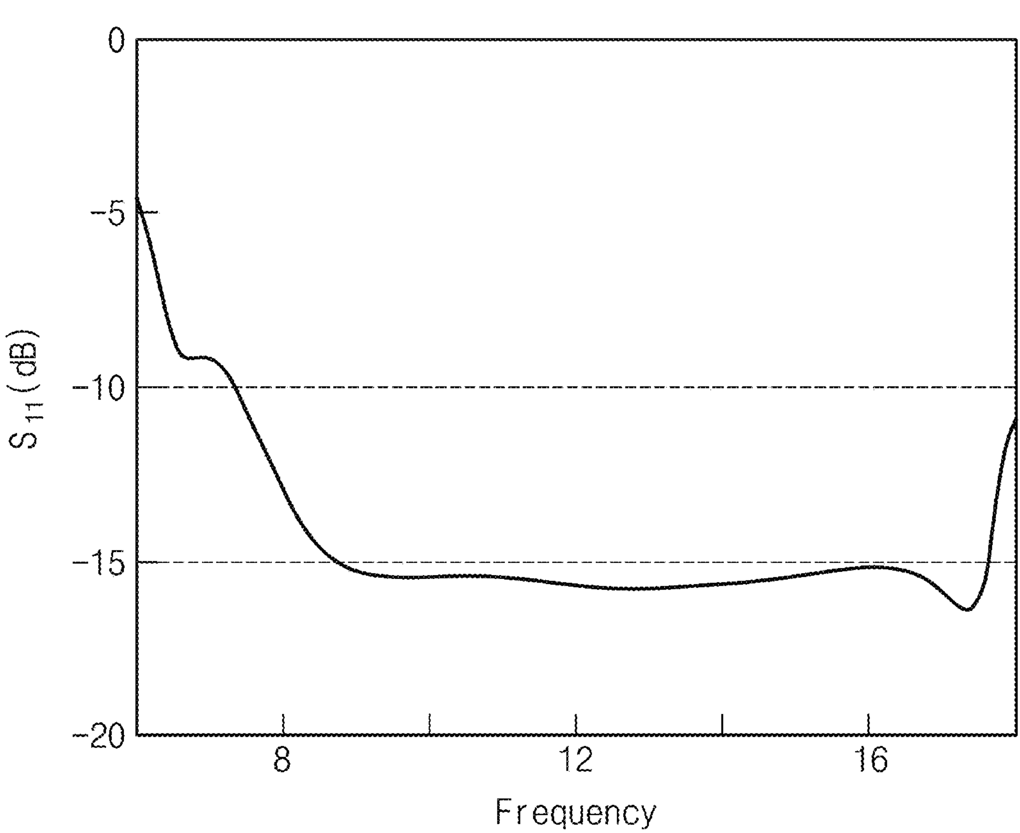
FIG. 8 is a diagram illustrating an absorption band frequency according to the thickness of the electromagnetic wave absorption layer.

FIG. 8 illustrates the absorption band frequency according to the thickness of the electromagnetic wave absorption layer 120.

Referring to FIG. 8, if the thickness of the electromagnetic wave absorption layer 120 decreases, the absorption band frequency may increase. That is, the electromagnetic wave absorption layer 120 may have an absorption band with a frequency inversely proportional to its thickness.

Figures 9A, 9B:
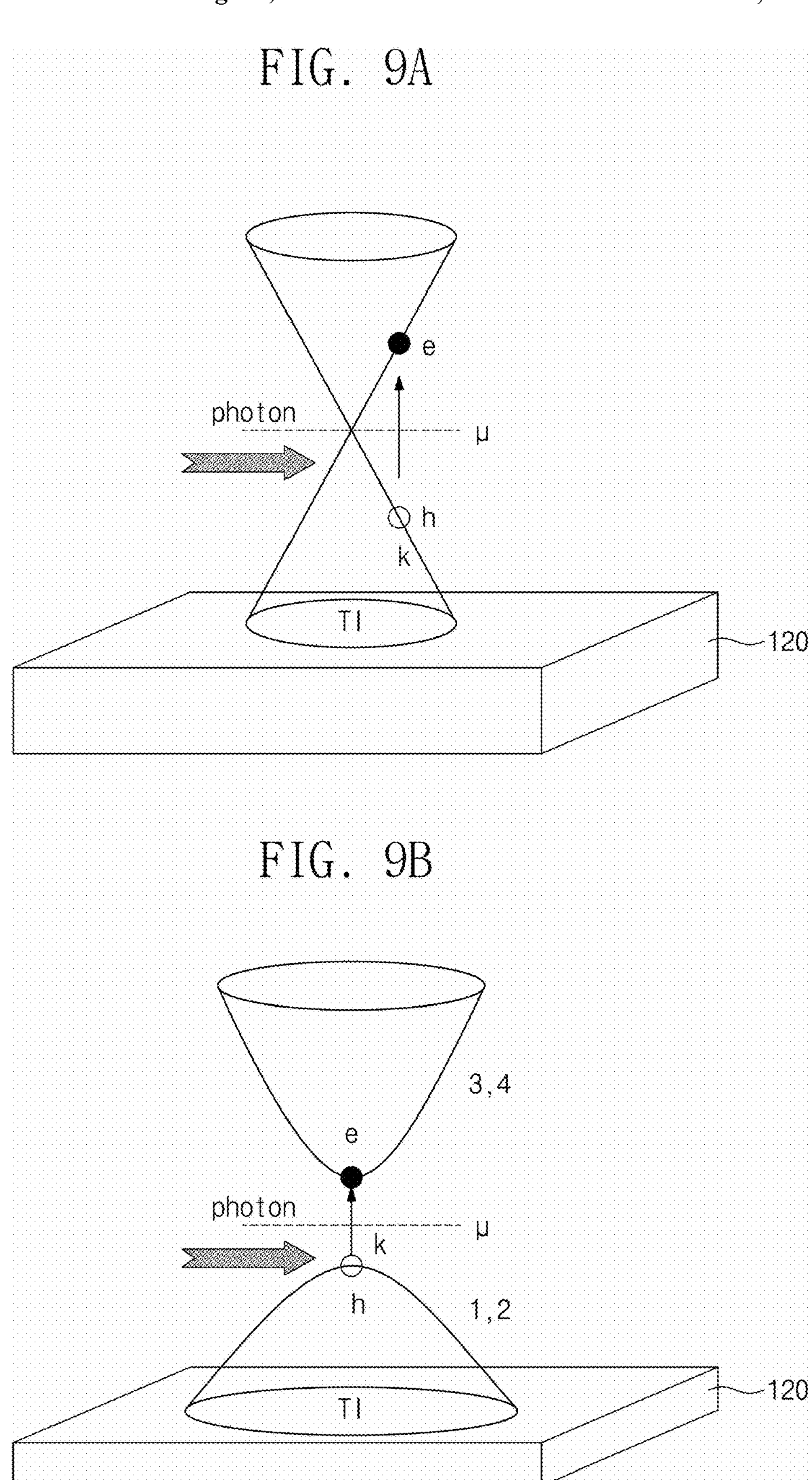
FIGS. 9A and 9B are diagrams illustrating the difference in band gap according to the thickness of the electromagnetic wave absorption layer of FIG. 1.

FIGS. 9A and 9B illustrates the difference in band gap depending on the thickness of the electromagnetic wave absorption layer 120 of FIG. 1.

Referring to FIGS. 9A and 9B, the electromagnetic wave absorption layer 120 may have a band gap that increases as its thickness decreases. The electromagnetic wave absorption layer 120 having a thick thickness may have a closed energy band gap. The thick electromagnetic wave absorption layer 120 may have high conductivity. The electromagnetic wave absorption layer 120 having a thick thickness may have an open energy band gap. The thin electromagnetic wave absorption layer 120 may include the topological insulator.

Figure 10:
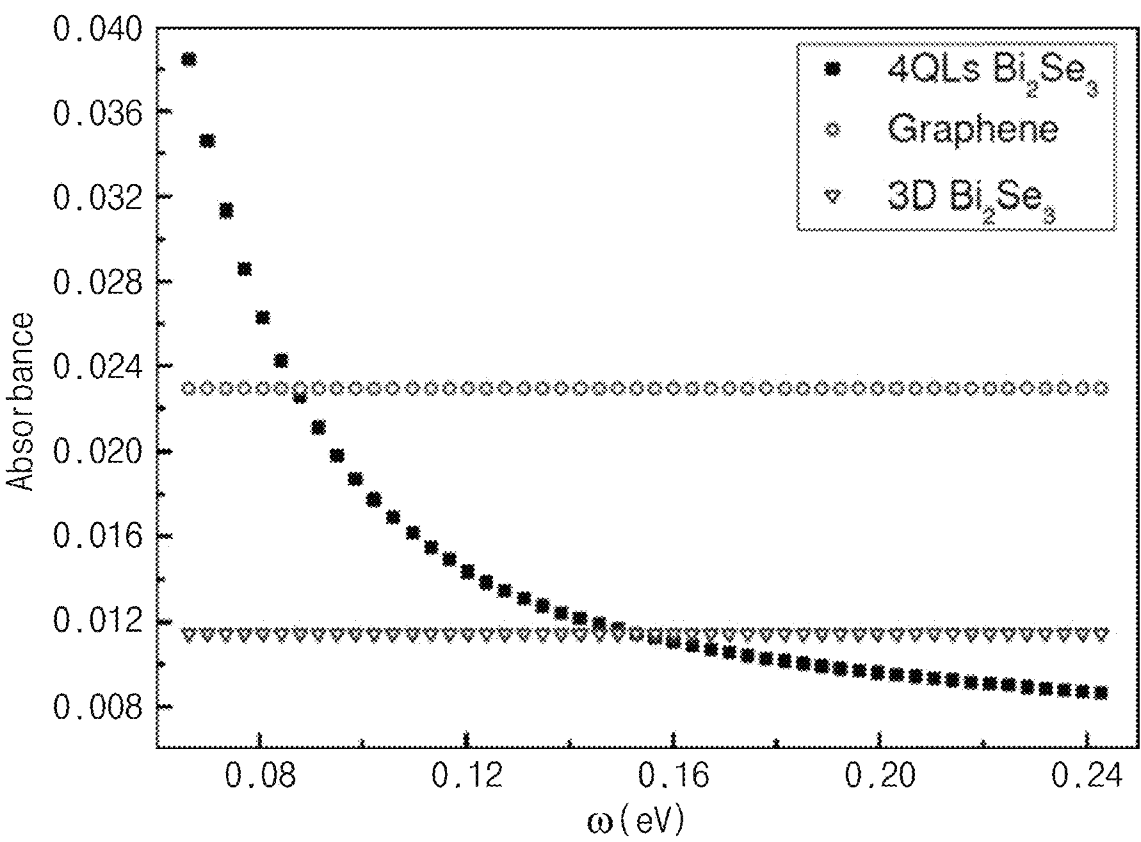
FIG. 10 shows graphs illustrating an absorption rate of the electromagnetic wave absorption layer and an absorption rate of a graphene layer.
Figure 11A:
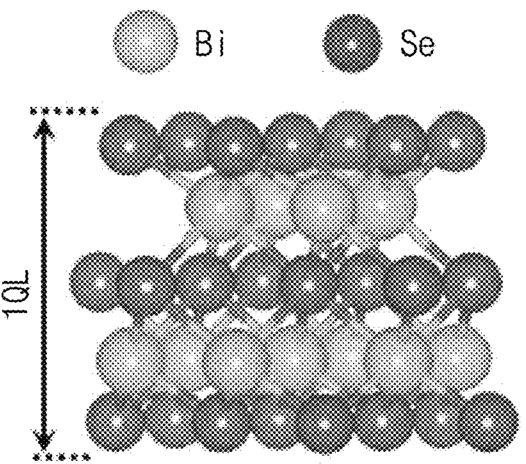
FIGS. 11A, 11B, 11C, 11D, 11E, and 11F are diagrams illustrating an example of $Bi_2Se_3$ of the electromagnetic wave absorption layer 120 of FIG. 1.
Figure 11B:
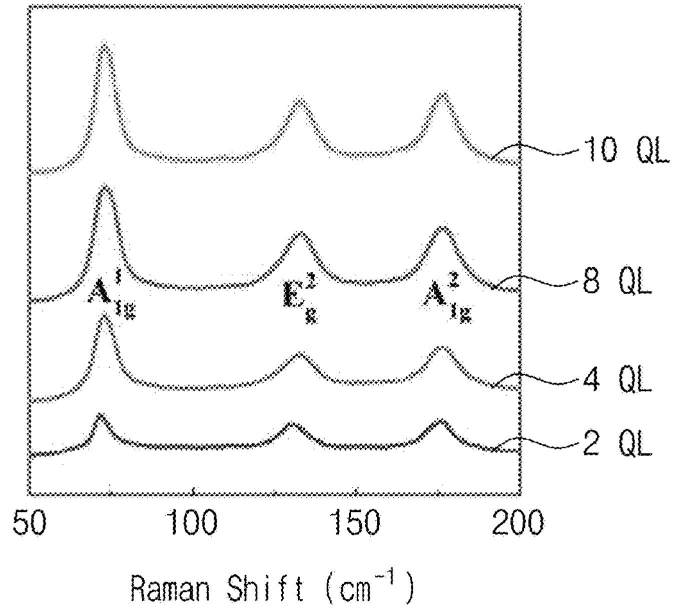
Figure 11C:
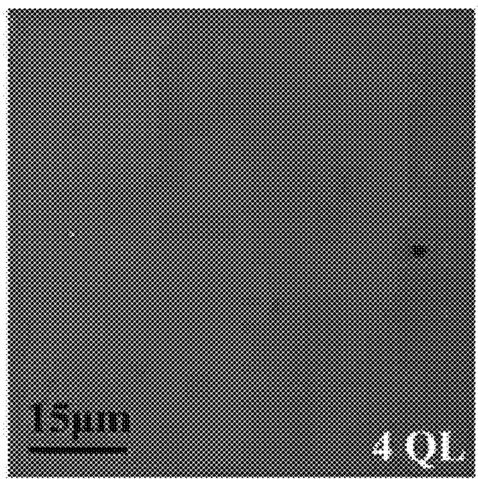
Figure 11D:
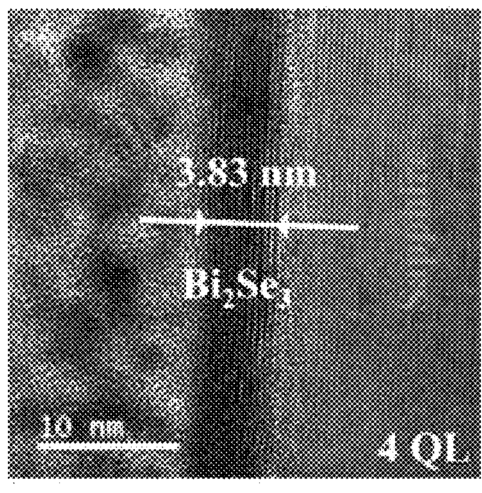
Figure 11E:
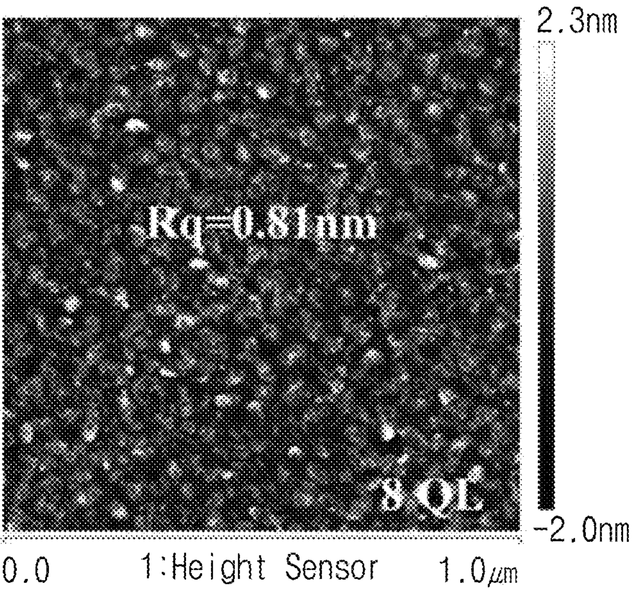
Figure 11F:
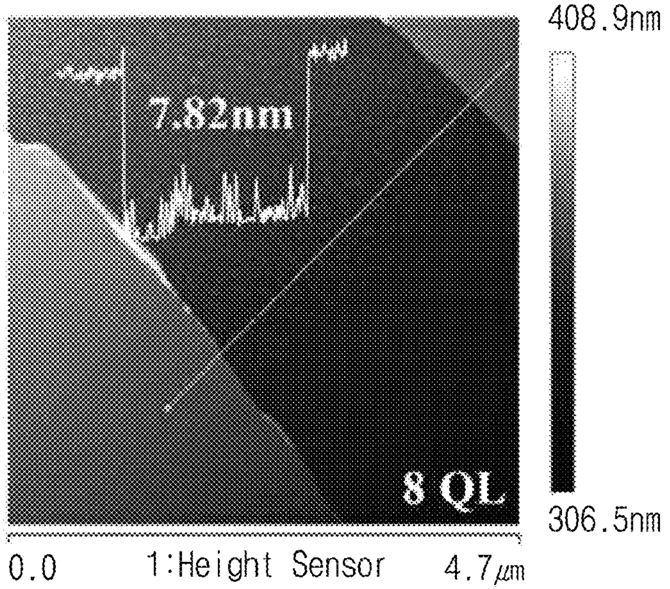

FIG. 10 illustrates the absorption rate of the electromagnetic wave absorption layer 120 and the absorption rate of a graphene layer.

Referring to FIGS. 9A, 9B, and 10, the electromagnetic wave absorption layer 120 of the electromagnetic wave absorption device 100 of an embodiment of the inventive concept may have a higher absorption rate than that of graphene as its thickness decreases. The thick electromagnetic wave absorption layer 120 is 3D $Bi_2Se_3$, and the thin electromagnetic wave absorption layer 120 is 4QLs $Bi_2Se_3$. The thin electromagnetic wave absorption layer 120 may have a higher absorption rate than that of graphene.

FIG. 11 illustrates an example of $Bi_2Se_3$ of the electromagnetic wave absorption layer 120 of FIG. 1.

Referring to FIG. 11, the electromagnetic wave absorption layer 120 may have a thickness of about 1 nm to about 10 mm. According to one example, $Bi_2Se_3$ of the electromagnetic wave absorption layer 120 may have 5 atomic layers of Se1-Bi-Se2-Bi—Se1 from 1QL as illustrated in (a), and have Raman spectra of 2-QL, 4-QL, 8-QL, and 10-QL $Bi_2Se_3$ thin films as illustrated in (b). (c) is a graph of the 4-QL $Bi_2Se_3$ thin film in (b), (d) is a cross-sectional HRTEM image of the 4-QL $Bi_2Se_3$ thin film, and (e) and (f) illustrate the surface roughness and thickness of the 8-QL $Bi_2Se_3$ thin film characterized by AFM. Based on (d), (e), and (f), the electromagnetic wave absorption layer 120 may have the thickness of about 1 nm to about 10 mm.

As a result, the electromagnetic wave absorption device 100 of an embodiment of the inventive concept may increase the absorption rate of electromagnetic waves by using the electromagnetic wave absorption layer 120 made of chalcogenide material.

As described above, the electromagnetic absorption device according to an embodiment of the inventive concept may increase the absorption rate of electromagnetic waves by using an electromagnetic wave absorption layer made of a chalcogenide material.

Although the embodiments of the inventive concept have been described with reference to the accompanying drawings, those of ordinary skill in the art to which the embodiment of the inventive concept pertains will understand that the embodiment of the inventive concept may be implemented in other specific forms without changing its technical idea or essential features. Therefore, it should be understood that the embodiments described above are illustrative and not restrictive in all respects.

What is claimed is:

1. An electromagnetic wave absorption device comprising:
- a substrate; and
- an electromagnetic wave absorption layer on the substrate,
- wherein the electromagnetic wave absorption layer includes a topological insulator layer and absorption patterns on the topological insulator layer, and
- wherein the electromagnetic wave absorption layer contains a chalcogenide material.

2. The device of claim 1, wherein the electromagnetic wave absorption layer contains Bi, Sb, $BizSe_3$, $BizTe_3$, $Sb_2Te_3$, $Bi_{1-x}Sb_x$, $Bi_{1.1}Sb_{0.9}Te_2S$, or $(Bi,Sb)_2(Se,Te,S)_3$.

3. The device of claim 1, wherein the electromagnetic wave absorption layer is on an entire surface of an upper surface of the substrate.

4. The device of claim 1, wherein the electromagnetic wave absorption layer includes a meta-structure.

5. The device of claim 4, wherein the meta-structure has a cross shape.

6. The device of claim 4, wherein the meta-structure has a bar shape extending in a first direction.

7. The device of claim 1, wherein
- the absorption patterns include a meta-structure.

8. The device of claim 1, wherein each of the absorption patterns has a cross shape.

9. The device of claim 1, wherein the electromagnetic wave absorption layer has a thickness of 1 nm to 10 mm.

10. The device of claim 1, wherein the topological insulator layer is on an entire surface of an upper surface of the substrate.

11. The device of claim 10, wherein the topological insulator layer contains the chalcogenide material, and
- the absorption patterns contain the chalcogenide material.

12. The device of claim 1, wherein the topological insulator layer contains the chalcogenide material.

13. The device of claim 1, wherein the absorption patterns contain the chalcogenide material.

14. The device of claim 1, wherein each of the absorption patterns has a scissor shape in a planar view.

15. A mobile phone, comprising:
- a rear case;
- a heat dissipation layer within the rear case;
- an electromagnetic wave absorption device on the heat dissipation layer, the electromagnetic wave absorption device including:
  - a substrate,
  - a topological insulator layer on the substrate, the topological insulator layer containing a chalcogenide material, and
  - absorption patterns on the topological insulator layer; and
- semiconductor elements on the electromagnetic wave absorption device.

* * * * *